(12) United States Patent
Kim et al.

(10) Patent No.: US 10,991,909 B2
(45) Date of Patent: Apr. 27, 2021

(54) ORGANIC LIGHT EMITTING DISPLAY DEVICE AND METHOD OF MANUFACTURING THE SAME

(71) Applicant: SAMSUNG DISPLAY CO., LTD., Yongin-si (KR)

(72) Inventors: Seol Kim, Seongnam-si (KR); Eunah Kim, Seoul (KR); Sungchan Jo, Seoul (KR)

(73) Assignee: SAMSUNG DISPLAY CO., LTD., Yongin-si (KR)

(*) Notice: Subject to any disclaimer, the term of this patent is extended or adjusted under 35 U.S.C. 154(b) by 24 days.

(21) Appl. No.: 16/246,865

(22) Filed: Jan. 14, 2019

(65) Prior Publication Data
US 2019/0229289 A1    Jul. 25, 2019

(30) Foreign Application Priority Data
Jan. 23, 2018 (KR) .......................... 10-2018-0008287

(51) Int. Cl.
*H01L 51/52* (2006.01)
*H01L 27/32* (2006.01)
(Continued)

(52) U.S. Cl.
CPC ...... *H01L 51/5253* (2013.01); *H01L 27/3244* (2013.01); *H01L 51/0097* (2013.01); *H01L 51/5256* (2013.01); *H01L 51/56* (2013.01); *H01L 2227/323* (2013.01); *H01L 2251/301* (2013.01); *H01L 2251/5338* (2013.01); *H01L 2251/558* (2013.01)

(58) Field of Classification Search
None
See application file for complete search history.

(56) References Cited

U.S. PATENT DOCUMENTS 9,520,577 B2   12/2016  Sato et al.
9,818,807 B2   11/2017  Park
(Continued)

FOREIGN PATENT DOCUMENTS

KR   1020160037496   4/2016
KR   1020160087982   7/2016
(Continued)

*Primary Examiner* — Michelle Mandala
(74) *Attorney, Agent, or Firm* — F. Chau & Associates, LLC

(57) ABSTRACT

An organic light emitting display device includes: a thin film transistor disposed in a display area of a substrate; an insulating layer disposed on the thin film transistor; an organic light emitting element disposed on the insulating layer and connected to the thin film transistor; and an encapsulation layer covering the organic light emitting element. The encapsulation layer includes: a first inorganic layer extending from the organic light emitting element to a non-display area; an organic layer disposed on the first inorganic layer; a second inorganic layer extending from the organic layer to the non-display area; and an organic pattern layer disposed between the first inorganic layer and the second inorganic layer and spaced apart from the organic layer in the non-display area. At least a part of the first inorganic layer and at least a part of the second inorganic layer may contact each other in the non-display area.

17 Claims, 7 Drawing Sheets

(51) Int. Cl.
 H01L 51/00 (2006.01)
 H01L 51/56 (2006.01)

(56) References Cited

U.S. PATENT DOCUMENTS

| | | |
|---|---|---|
| 9,911,943 B2 | 3/2018 | Han |
| 10,326,110 B2* | 6/2019 | Kwon ............... H01L 51/5256 |
| 2010/0156779 A1* | 6/2010 | Park ..................... G02F 1/167 |
| | | 345/107 |
| 2016/0064690 A1* | 3/2016 | Kook ................ H01L 51/5256 |
| | | 257/40 |
| 2016/0079564 A1* | 3/2016 | Shim ................ H01L 27/3246 |
| | | 257/40 |
| 2017/0040347 A1 | 2/2017 | Seo et al. |
| 2017/0062534 A1 | 3/2017 | Jiang et al. |
| 2017/0098798 A1 | 4/2017 | Park et al. |
| 2018/0090714 A1 | 3/2018 | Kim et al. |

FOREIGN PATENT DOCUMENTS

| | | |
|---|---|---|
| KR | 101661809 | 9/2016 |
| KR | 1020160150255 | 12/2016 |
| KR | 1020170017057 | 2/2017 |
| KR | 1020170026085 | 3/2017 |
| KR | 1020170041339 | 4/2017 |

* cited by examiner

ORGANIC LIGHT EMITTING DISPLAY DEVICE AND METHOD OF MANUFACTURING THE SAME

CROSS-REFERENCE TO RELATED APPLICATION

This application claims priority under 35 U.S.C. § 119 to Korean Patent Application No. 10-2018-0008287, filed on Jan. 23, 2018, in the Korean Intellectual Property Office (KIPO), the disclosure of which is incorporated by reference herein in its entirety.

TECHNICAL FIELD

Exemplary embodiments of the present invention relate to an organic light emitting display device, and a method of manufacturing the same.

DISCUSSION OF RELATED ART

Display device is an apparatus capable of providing a user with visual information such as an image or a text. Currently, display devices are being manufactured into various forms in order to generate various types of images and texts.

Organic light emitting diode (OLED) display devices are self-light-emitting type display devices which electrically excite an organic compound to emit light. Since such OLED display devices may be driven at a low voltage, are easy to be slimmed down, have a wide viewing angle, and are quick in response, thus capable of solving issues of Liquid-crystal-display (LCD) devices, they are garnering a lot of attention as next generation display devices.

In recent times, a thin film encapsulation layer including an organic layer and an inorganic layer has been used as a means for sealing an organic light emitting element to achieve slimness and/or flexibility of the OLED display devices. The thin film encapsulation layer has a multilayer thin film structure in which organic layers and inorganic layers are alternately laminated. When the organic layer is exposed through an end portion of the thin film encapsulation layer, the exposed portion may become an infiltration path for moisture and oxygen. The penetration of external moisture and oxygen to the OLED display device may be delayed or blocked, when the end portion of the thin film encapsulation layer is sealed with an inorganic layer. However, when such inorganic layers contact each other in at least a part of the sealing layer, there is a possibility that stress is concentrated at the interface between the inorganic layers and cracks are generated.

SUMMARY

Exemplary embodiments of the present invention may be directed to an organic light emitting display device partially modified in terms of the shape of an encapsulation layer to absorb stress caused by an external impact, to suppress crack generation by imparting flexibility, and realizing a robust structure of the encapsulation layer, and to a method of manufacturing the organic light emitting display device.

According to an exemplary embodiment of the present invention, an organic light emitting display device includes: a substrate including a display area and a non-display area; a thin film transistor disposed on the substrate in the display area; an insulating layer disposed on the thin film transistor; an organic light emitting element disposed on the insulating layer and connected to the thin film transistor; and an encapsulation layer covering the organic light emitting element. The encapsulation layer includes: a first inorganic layer disposed on the organic light emitting element and extending from the organic light emitting element to the non-display area; an organic layer disposed on the first inorganic layer; a second inorganic layer disposed on the organic layer and extending from the organic layer to the non-display area; and an organic pattern layer disposed between the first inorganic layer and the second inorganic layer so as to be spaced apart from the organic layer in the non-display area. At least a part of the first inorganic layer and at least a part of the second inorganic layer may contact each other in the non-display area.

At least a part of the organic pattern layer may overlap the insulating layer in a plan view.

The organic pattern layer may include a material substantially the same as a material which the organic layer includes.

The organic layer may include at least one kind of organic material selected from: acrylic resins, methacrylic resins, isoprene resins, vinyl resins, epoxy resins, urethane resins, cellulose resins, phenylene resins, and imide resins.

The organic pattern layer may have a width of about 10 μm or more and a thickness of about 0.1 μm or more.

The first inorganic layer and the second inorganic layer may have a substantially equal area in a plan view, and an area of the organic layer may be less than an area of the first inorganic layer and an area of the second inorganic layer.

The first inorganic layer and the second inorganic layer may each independently include at least one kind of inorganic material selected from: silicon oxide, silicon nitride, silicon oxynitride, aluminum oxide, aluminum nitride, aluminum oxynitride, titanium oxide, titanium nitride, tantalum oxide, tantalum nitride, hafnium oxide, hafnium nitride, zirconium oxide, zirconium nitride, cerium oxide, cerium nitride, tin oxide, tin nitride, and magnesium oxide.

The organic light emitting display device may further include a dam portion disposed in the non-display area of the substrate.

The insulating layer may include a side portion inclined in a direction toward the dam portion.

The organic pattern layer may be disposed between the dam portion and the inclined side portion of the insulating layer.

The organic pattern layer may be disposed at an area in which at least a part of the non-display area where the first inorganic layer and the second inorganic layer contact each other and at least a part of the inclined side portion of the insulating layer and the organic pattern layer overlap each other in a plan view.

The dam portion may be provided in plural and the plurality of dam portions may have different heights.

The organic light emitting display device may further include a pixel defining layer disposed between the insulating layer and the encapsulation layer, the pixel defining layer defining a pixel area of the organic light emitting element. The dam portion may include a material substantially the same as a material which at least one of the insulating layer and the pixel defining layer includes.

The dam portion may include a first layer including a material substantially the same as a material which the insulating layer includes; and a second layer on the first layer, the second layer including a material substantially the same as a material which the pixel defining layer includes.

According to an exemplary embodiment of the present invention, a method of manufacturing the organic light emitting display device includes: forming a thin film transistor in a display area of a substrate, the substrate including the display area and a non-display area; forming an insulating layer on the thin film transistor; forming an organic light emitting element on the insulating layer and connecting the organic light emitting element with the thin film transistor; and forming an encapsulation layer covering the organic light emitting element. The forming of the encapsulation layer includes: forming a first inorganic layer to cover the organic light emitting element and to extend from the organic light emitting element to the non-display area; forming an organic layer on the first inorganic layer; removing a part of the organic layer and leaving a part of the organic layer in the non-display area to form an organic pattern layer spaced apart from the organic layer; and forming a second inorganic layer to cover the organic layer and to extend from the organic layer to the non-display area.

The first inorganic layer and the second inorganic layer may have a substantially equal area in a plan view, and an area of the organic layer may be less than an area of the first inorganic layer and an area of the second inorganic layer.

The organic layer may be formed by one of an inkjet method, a slit coating method, a screen printing method, an evaporation method, and a chemical vapor deposition method.

The forming of the organic pattern layer may include forming the organic pattern layer by an ashing process using a cleaning mask.

The method may further include etching the insulating layer formed in the non-display area of the substrate to form a dam portion.

The organic pattern layer may be disposed between the dam portion and one side portion of the insulating layer.

According to an exemplary embodiment of the present invention, an organic light emitting display device includes: a thin film transistor disposed on a substrate in a display area, the substrate including the display area and a non-display area; an insulating layer disposed on the thin film transistor, the insulating layer including an inclined side portion in the non-display area; an organic light emitting element disposed on the insulating layer and connected to the thin film transistor; and an encapsulation layer covering the organic light emitting element. The encapsulation layer includes: a first inorganic layer disposed on the organic light emitting element and extending from the organic light emitting element to the non-display area; an organic layer disposed on the first inorganic layer to cover a part of the first inorganic layer; an organic pattern layer disposed on the first inorganic layer, spaced apart from the organic layer, and overlapping at least a part of the inclined side portion of the insulating layer in a plan view; and a second inorganic layer disposed on the organic layer, extending from the organic layer to the non-display area, covering the organic pattern layer, and contacting the first inorganic layer in the non-display area where the organic layer and the organic pattern layer are not disposed on the first inorganic layer.

The organic pattern layer may include a material substantially the same as a material which the organic layer includes.

The first inorganic layer and the second inorganic layer may have a substantially equal area in the plan view.

BRIEF DESCRIPTION OF THE DRAWINGS

A more complete appreciation of the present invention will become more apparent by describing in detail exemplary embodiments thereof with reference to the accompanying drawings, in which.

Figure 1:
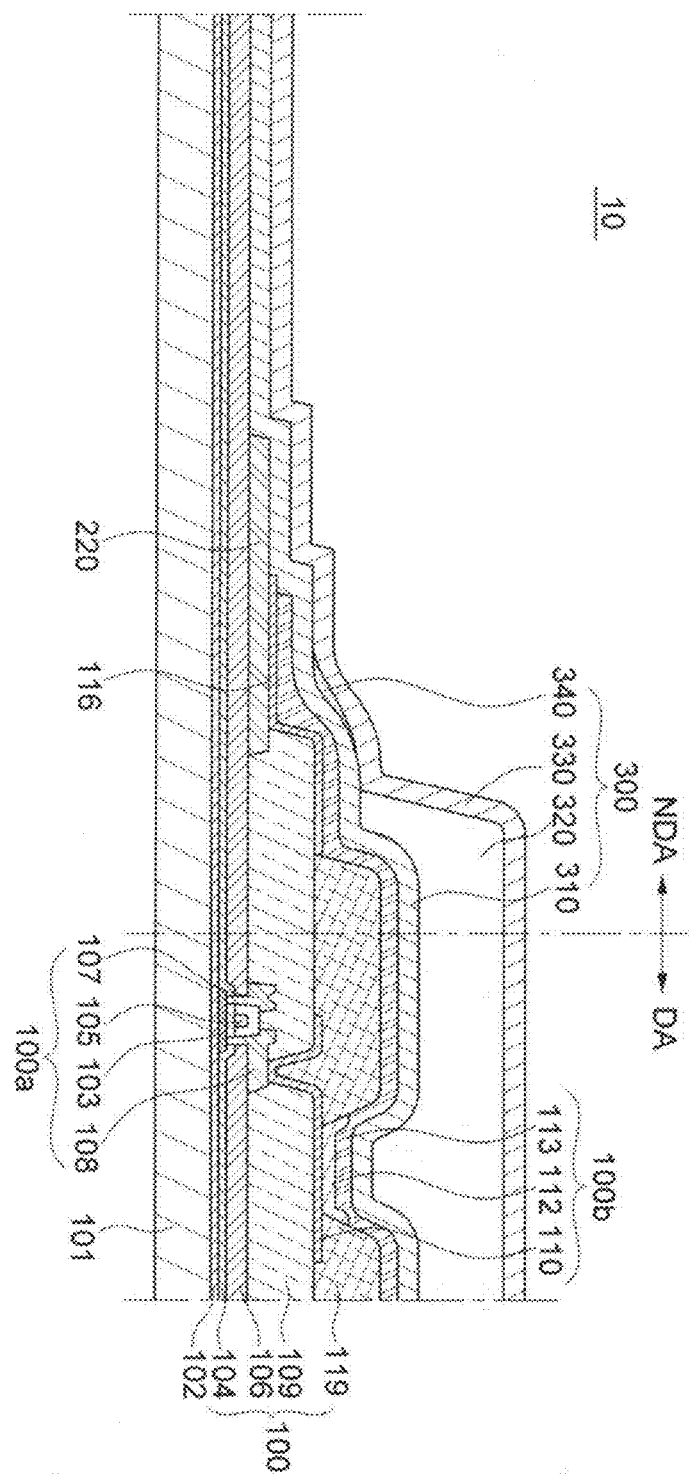
FIG. 1 is a cross-sectional view illustrating an organic light emitting display device according to an exemplary embodiment of the present invention.

Since the drawings in FIGS. 1-2 and 5-8 are intended for illustrative purposes, the elements in the drawings are not necessarily drawn to scale. For example, some of the elements may be enlarged or exaggerated for clarity purpose.

DETAILED DESCRIPTION OF THE EMBODIMENTS

Exemplary embodiments will now be described more fully hereinafter with reference to the accompanying drawings. Although the present invention may be modified in various manners and have several embodiments, exemplary embodiments are illustrated in the accompanying drawings and will be mainly described in the specification. However, the scope of the present invention is not limited to the exemplary embodiments and should be construed as including all the changes, equivalents and substitutions included in the spirit and scope of the present invention.

When a layer, area, or plate is referred to as being "on" another layer, area, or plate, it may be directly on the other layer, area, or plate, or intervening layers, areas, or plates may be present therebetween. Conversely, when a layer, area, or plate is referred to as being "directly on" another layer, area, or plate, intervening layers, areas, or plates may be absent therebetween. Further, when a layer, area, or plate is referred to as being "below" another layer, area, or plate, it may be directly below the other layer, area, or plate, or intervening layers, areas, or plates may be present therebetween. Conversely, when a layer, area, or plate is referred to as being "directly below" another layer, area, or plate, intervening layers, areas, or plates may be absent therebetween.

The spatially relative terms "below", "beneath", "lower", "above", "upper" or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in the other direction and thus the spatially relative terms may be interpreted differently depending on the orientations.

Throughout the specification, when an element is referred to as being viewed "in a plan view", the element is viewed from the above, and when an element is referred to as being viewed "on a cross-sectional view", a cross-sectional surface of the element that is cut vertically is viewed from the lateral side.

Throughout the specification, when an element is referred to as being "connected" to another element, the element is "directly connected" to the other element, or "electrically connected" to the other element with one or more intervening elements interposed therebetween. It will be further understood that the terms "comprises", "comprising", "includes" and/or "including" when used in this specification, specify the presence of stated features, integers, steps, operations, elements, components and/or groups, but do not preclude the presence or addition of one or more other features, integers, steps, operations, elements, components and/or groups thereof.

It will be understood that, although the terms "first", "second", "third" or the like may be used herein to describe various elements, these elements should not be limited by these terms. These terms are only used to distinguish one element from another element. Thus, "a first element" discussed below could be termed "a second element" or "a third element" and "a second element" and "a third element" may be termed likewise without departing from the teachings herein.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10% or 5% of the stated value.

Unless otherwise defined, all terms used herein (including technical and scientific terms) have the same meaning as commonly understood by those skilled in the art to which the present invention pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the present specification.

Some of the parts which are not associated with the description may not be provided in order to specifically describe exemplary embodiments of the present invention and like reference numerals refer to like elements throughout the specification.

Hereinafter, an exemplary embodiment of the present invention will be described with reference to FIG. 1.

FIG. 1 is a cross-sectional view illustrating an organic light emitting display device (hereinafter, "organic light emitting diode (OLED) display device" by way of example) 10 according to an exemplary embodiment of the present invention.

Referring to FIG. 1, an OLED display device 10 according to an exemplary embodiment of the present invention includes a substrate 101, a display unit 100 in a display area DA of the substrate 101, and an encapsulation layer 300 across the display area DA and a non-display area NDA for sealing the display unit 100.

The substrate 101 may include various materials. For example, the substrate 101 may include a transparent glass material including silicon oxide ($SiO_2$) as a main component. However, the present invention is not limited thereto. For example, in an exemplary embodiment of the present invention, the substrate 101 may include a transparent plastic material and have flexibility. Such a plastic material may include an insulating organic material selected from one of, for example, polyethersulphone (PES), polyacrylate (PAR), polyetherimide (PEI), polyethylene naphthalate (PEN), polyethylene terephthalate (PET), polyphenylene sulfide (PPS), polyallylate, polyimide (PI), polycarbonate (PC), cellulose triacetate (TAC), and cellulose acetate propionate (CAP).

In the case of a bottom emission type where images are displayed toward the substrate 101, it is necessary that the substrate 101 is formed of a transparent material. However, in the case of a top emission type where images are displayed in a direction opposite to the substrate 101, it is not necessary that the substrate 101 includes a transparent material, and the substrate 101 may be either opaque or reflective and may include a metal material. In an exemplary embodiment of the present invention, the substrate 101 may include metals known in the art, and may include at least one of, for example, iron (Fe), chromium (Cr), manganese (Mn), nickel (Ni), titanium (Ti), molybdenum (Mo), stainless steel (SUS), Invar alloys, Inconel alloys, and Kovar alloys.

The substrate 101 may include a display area DA in which light is emitted by the display unit 100 to realize images to be recognized by users, and a non-display area NDA which corresponds to the remaining part other than the display area DA. An organic light emitting element (hereinafter, "organic light emitting diode (OLED)" by way of example) 100b may be disposed in the display area DA, and a power wiring 220 for supplying power to the OLED 100b may be disposed in the non-display area NDA. In addition, a power supplier or a pad unit for applying electric signals from a signal generator to the display area DA may be disposed in the non-display area NDA.

The display unit 100 will be described in more detail. A buffer layer 102 may be disposed on the substrate 101. The buffer layer 102 may provide a planar surface on top of the substrate 101 and may block foreign matter or moisture penetrating through the substrate 101. For example, the buffer layer 102 may include an inorganic material such as, for example, silicon oxide ($SiO_2$), silicon nitride ($Si_3N_4$), silicon oxynitride (SiON), aluminum oxide ($Al_2O_3$), aluminum nitride (AlN), titanium oxide ($TiO_2$), or titanium nitride (TiN), or an organic material such as, for example, polyimide, polyester, or acrylic polymers, and may have a multilayer structure including the above-described materials. The buffer layer 102 is formed in the display area DA and may extend to the non-display area NDA.

A thin film transistor 100a and the OLED 100b electrically connected to the thin film transistor 100a may be disposed in the display area DA over the buffer layer 102 on the substrate 101.

The thin film transistor 100a may include an active layer 103, a gate electrode 105, a source electrode 107, and a drain electrode 108. Hereinafter, the thin film transistor 100a of a top gate type in which the active layer 103, the gate electrode 105, the source electrode 107, and the drain electrode 108 are sequentially disposed will be described. However, the present invention is not limited thereto. For example, in an exemplary embodiment of the present invention, various types of thin film transistors 100a such as a bottom gate type may be employed.

The active layer 103 is disposed on the buffer layer 102. The active layer 103 may include a semiconductor material known in the art, for example, amorphous silicon or poly crystalline silicon. In an exemplary embodiment of the present invention, the active layer 103 may include an organic semiconductor material or the like. Alternatively, in an exemplary embodiment of the present invention, the active layer 103 may include an oxide semiconductor material, and thus may include an oxide of a material selected from group 12, 13, or 14 metal elements such as, for example, zinc (Zn), indium (In), gallium (Ga), tin (Sn), cadmium (Cd), germanium (Ge), or combinations thereof. The oxide semiconductor materials have high mobility, and thus may be suitable for OLED application. In addition, since the oxide semiconductor materials usually have wide-bandgaps, they can also be transparent.

A gate insulating layer 104 is disposed on the active layer 103, serves to insulate the active layer 103 from the gate electrode 105, and may have a single-layer structure or a multilayer structure, with each layer including at least one inorganic material of, for example, silicon oxide ($SiO_2$) and silicon nitride ($Si_3N_4$). The gate insulating layer 104 may not only be disposed in the display area DA but also may extend to a part of the non-display area NDA.

The gate electrode 105 is disposed on the gate insulating layer 104, and may be connected to a gate line for applying an on/off signal to the thin film transistor 100a. The gate electrode 105 may include a low resistive metal material known in the art. In consideration of close contactness to an adjacent layer, surface flatness of a layer to be laminated thereon, and processability, the gate electrode 105 may have a single-layer structure or a multilayer structure, with each layer including at least one of, for example, aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), copper (Cu), and the like.

An insulating interlayer 106 is disposed on the gate electrode 105, and insulates the gate electrode 105 from the source electrode 107 and the drain electrode 108. The insulating interlayer 106 may not only be disposed in the display area DA but also extend to a part of the non-display area NDA. The insulating interlayer 106 may have a single-layer structure or a multilayer structure, with each layer including an inorganic material. For example, the inorganic material may be metal oxide or metal nitride such as, for example, silicon oxide ($SiO_2$), silicon nitride ($Si_3N_4$), silicon oxynitride (SiON), aluminum oxide ($Al_2O_3$), titanium oxide ($TiO_2$), tantalum oxide ($Ta_2O_5$), hafnium oxide ($HfO_2$), zirconium oxide ($ZrO_2$), or the like.

The source electrode 107 and the drain electrode 108 are disposed on the insulating interlayer 106. Each of the source electrode 107 and the drain electrode 108 may have a single-layer structure or a multilayer structure, with each layer including a metal known in the art. The metal may include at least one of, for example, aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), copper (Cu), and the like. The source electrode 107 and the drain electrode 108 are each disposed to contact an area of the active layer 103. For example, the insulating interlayer 106 and the gate insulating layer 104 are formed to expose a source area and a drain area of the active layer 103 through openings, and the source electrode 107 and the drain electrode 108 are formed to fill the openings to contact the source area and the drain area of the active layer 103, respectively.

The thin film transistor 100a is electrically connected to the OLED 100b to drive the OLED 100b and is covered with and protected by an insulating layer 109. The insulating layer 109 may include an inclined side portion in the non-display area NDA.

The insulating layer 109 eliminates a step (i.e., a height difference) caused by the thin film transistor 100a and planarizes an upper surface above the thin film transistor 100a so as to substantially prevent defects from occurring in the OLED 100b due to unevenness therebelow. The insulating layer 109 may have a single-layer structure or a multilayer structure including an inorganic insulating layer, an organic insulating layer, or both of the inorganic insulating layer and the organic insulating layer that are known in the art. Examples of a material forming the inorganic insulating layer may include but is not limited to: $SiO_2$, $Si_3N_4$, SiON, $Al_2O_3$, $TiO_2$, $Ta_2O_5$, $HfO_2$, $ZrO_2$, barium strontium titanate (BST), lead zirconate titanate (PZT) or a mixture thereof. The organic insulating layer may include a common polymer known in the art, and examples of a material forming the organic insulating layer may include but is not limited to: polymethylmethacrylate (PMMA), polystyrene (PS), polymer derivatives having a phenolic group, acrylic polymers, imide polymers, arylether polymers, amide polymers, fluorine polymers, p-xylene polymers, vinyl alcohol polymers, or blends thereof. In addition, the insulating layer 109 may be formed as a composite laminate including an inorganic insulating layer and an organic insulating layer.

On the insulating layer 109, the OLED 100b is disposed. The OLED 100b is electrically connected to the thin film transistor 100a, and includes a first electrode 110, a second electrode 113 opposing the first electrode 110, and an intermediate layer 112 interposed between the first electrode 110 and the second electrode 113.

The first electrode 110 is disposed on the insulating layer 109 and may be electrically connected to the thin film transistor 100a, specifically to the drain electrode 108, through a contact hole defined in the insulating layer 109. The first electrode 110 may have various shapes, for example, may be patterned into an island shape. The first electrode 110 may be a reflective electrode, and may include a reflective layer including, for example, Ag, Mg, Al, Pt, Pd, Au, Ni, Nd, Ir, Cr or a compound thereof, and a transparent or translucent electrode layer disposed on the reflective layer. The transparent or translucent electrode layer may include at least one of, for example, indium tin oxide (ITO), indium zinc oxide (IZO), zinc oxide (ZnO), indium oxide ($In_2O_3$), indium gallium oxide (IGO), and aluminum zinc oxide (AZO).

The second electrode 113 which is disposed to oppose the first electrode 110 may be a transparent or translucent electrode. For example, the second electrode 113 may include a metal thin film that has a low work function and includes, for example, Li, Ca, lithium fluoride (LiF)/Ca, LiF/Al, Al, Ag, Mg, or compounds thereof. In addition, an auxiliary electrode layer or a bus electrode that includes a transparent electrode forming material such as, for example, ITO, IZO, ZnO, or $In_2O_3$ may be further provided on the metal thin film. Accordingly, the second electrode 113 may transmit the light emitted from the organic light emitting layer included in the intermediate layer 112. That is, the light emitted from the organic light emitting layer may be emitted directly toward the second electrode 113 or may be directed toward the second electrode 113 after being reflected by the first electrode 110 which is formed as a reflective electrode.

The display unit 100 is not limited to the top emission type. For example, in an exemplary embodiment of the present invention, the display unit 100 may be a bottom emission type in which light emitted from the organic light emitting layer is emitted toward the substrate 101. In such a case, the first electrode 110 may be a transparent or translucent electrode, and the second electrode 113 may be a reflective electrode. In addition, in an exemplary embodiment of the present invention, the display unit 100 may be a double-sided emission type that emits light toward both top and bottom directions.

In an exemplary embodiment of the present invention, a pixel defining layer 119 including an insulating material may be disposed on the first electrode 110 and between the insulating layer 109 and the encapsulation layer 300. The pixel defining layer 119 exposes a predetermined area of the first electrode 110, and the intermediate layer 112 including an organic light emitting layer is disposed in the exposed area. That is, the pixel defining layer 119 defines a pixel area of the OLED. The pixel defining layer 119 may include at least one organic insulating material of, for example, polyimide, polyamide, an acrylic resin, benzocyclobutene, and a phenol resin, and may be formed by spin coating.

The organic light emitting layer included in the intermediate layer 112 may include a low molecular weight organic material or a high molecular weight organic material. In addition to the organic light emitting layer, the intermediate layer 112 may further include functional layers known in the art, e.g., a hole transport layer (HTL), a hole injection layer (HIL), an electron transport layer (ETL), and an electron injection layer (EIL) in a selected manner.

Although only one OLED is illustrated in FIG. 1, the display unit 100 may include a plurality of OLEDs 100b. Each OLED 100b may form one pixel, and a red, green, blue, or white color may be realized in each pixel. In addition, a color conversion layer or a color filter for converting the emitted light into a predetermined color may be further provided.

The encapsulation layer 300 seals the display unit 100 to substantially prevent the display unit 100 from being deteriorated. For example, the encapsulation layer 300 may protect the display unit 100 from external oxygen and moisture. The encapsulation layer 300 may have a multilayer thin film structure in which inorganic layers and organic layers are alternately stacked.

In an exemplary embodiment of the present invention, the encapsulation layer 300 includes a first inorganic layer 310 disposed on the OLED 100b and extending from the OLED 100b to the non-display area NDA, an organic layer 320 disposed on the first inorganic layer 310, a second inorganic layer 330 disposed on the organic layer 320 and extending from the organic layer 320 to the non-display area NDA, and an organic pattern layer 340 spaced apart from the organic layer 320 in the non-display area NDA and disposed between the first inorganic layer 310 and the second inorganic layer 330.

The first inorganic layer 310 may seal the OLED 100b and may extend to cover a portion of the non-display area NDA, thereby securely preventing permeation of oxygen or moisture into the OLED 100b. The first inorganic layer 310 may have a single-layer structure or a multilayer structure, with each layer including: metal oxide or metal nitride known in the art. For example, the first inorganic layer 310 may include at least one kind of inorganic material selected from: silicon oxide ($SiO_2$), silicon nitride ($Si_3N_4$), silicon oxynitride (SiON), aluminum oxide ($Al_2O_3$), aluminum nitride (AlN), aluminum oxynitride (AlON), titanium oxide ($TiO_2$), titanium nitride (TiN), tantalum oxide ($Ta_2O_5$), tantalum nitride (TaN), hafnium oxide ($HfO_2$), hafnium nitride (HfN), zirconium oxide ($ZrO_2$), zirconium nitride (ZrN), cerium oxide ($CeO_2$), cerium nitride (CeN), tin oxide ($SnO_2$), tin nitride ($Sn_3N_4$), and magnesium oxide (MgO).

The organic layer 320 covers a part of the first inorganic layer 310 and alleviates the internal stress of the first inorganic layer 310 or fills microcracks and pinholes of the first inorganic layer 310, thereby enhancing effects of preventing permeation of moisture or oxygen. The organic layer 320 may have a single-layer structure or a multilayer structure, with each layer including a polymer known in the art. For example, the organic layer 320 may include at least one kind of organic material selected from: acrylic resins, methacrylic resins, isoprene resins, vinyl resins, epoxy resins, urethane resins, cellulose resins, phenylene resins, and imide resins. Moreover, the organic layer 320 may include small organic molecules which may be crosslinked afterwards. The organic layer 320 is disposed so as to cover a part of the first inorganic layer 310, and thus an area of the organic layer 320 may be less than an area of the first inorganic layer 310 and an area of the second inorganic layer 330 to be described. The part of the first inorganic layer 310 covered by the organic layer 320 may include major portion in the display area DA and may also include some portion in the non-display area NDA.

The second inorganic layer 330 may be disposed on the organic layer 320 and may extend from the organic layer 320 to cover a part of the non-display area NDA, thereby securely preventing permeation of oxygen and moisture. The second inorganic layer 330 may have an area substantially equal to an area of the first inorganic layer 310 in a plan view. The second inorganic layer 330 may have a single-layer structure or a multilayer structure, with each layer including: metal oxide or metal nitride known in the art. For example, the second inorganic layer 330 may include at least one kind of inorganic material selected from: $SiO_2$, $Si_3N_4$, SiON, $Al_2O_3$, AlN, AlON, $TiO_2$, TiN, $Ta_2O_5$, TaN, $HfO_2$, HfN, $ZrO_2$, ZrN, $CeO_2$, CeN, $SnO_2$, $Sn_3N_4$, and MgO. The component of the second inorganic layer 330 may be substantially the same as or different from the component of the first inorganic layer 310.

Figure 3:
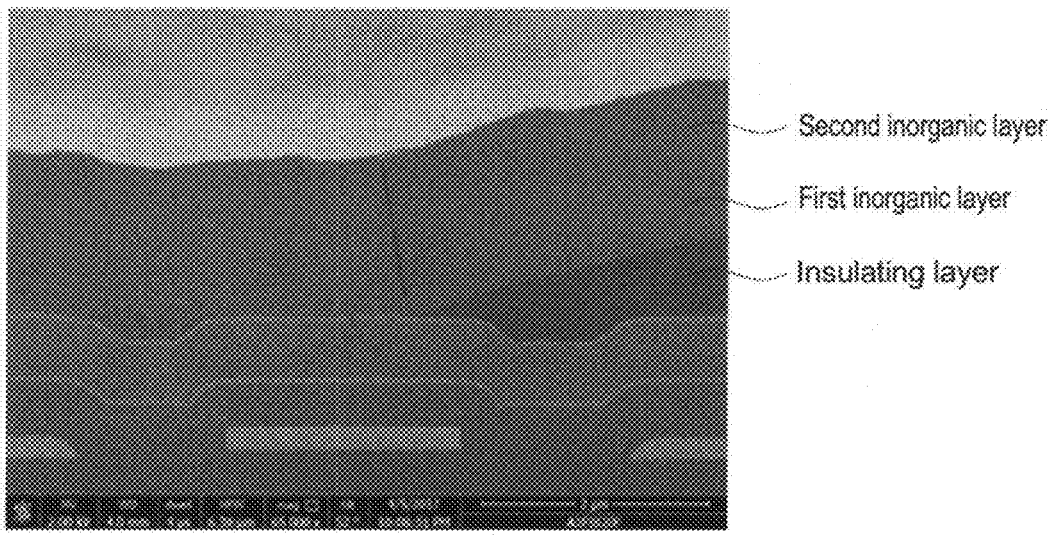
FIG. 3 is a scanning electron microscopy (SEM) photograph showing a cross-sectional structure of an organic light emitting display device including a conventional encapsulation layer.

In an exemplary embodiment of the present invention, since the first inorganic layer 310 and the second inorganic layer 330 have a substantially equal area and the organic layer 320 interposed therebetween has an area less than the area of the first inorganic layer 310 and the area of the second inorganic layer 330, there exists an area in the non-display area NDA where at least a portion of the first inorganic layer 310 and at least a portion of the second inorganic layer 330 contact each other. In such a non-display area NDA where the first and second inorganic layers 310 and 330 contact each other, peeling is likely to occur at an interface between the first and second inorganic layers 310 and 330, and there is a high possibility that stress is concentrated at the interface and cracks are generated. In particular, when an impact caused by an external force is applied to an area of the non-display area NDA where the first and second inorganic layers 310 and 330 contact each other acts as a weak point, cracks may easily occur at this weak point as illustrated in FIG. 3, thereby inevitably resulting in defective products.

Figure 4:
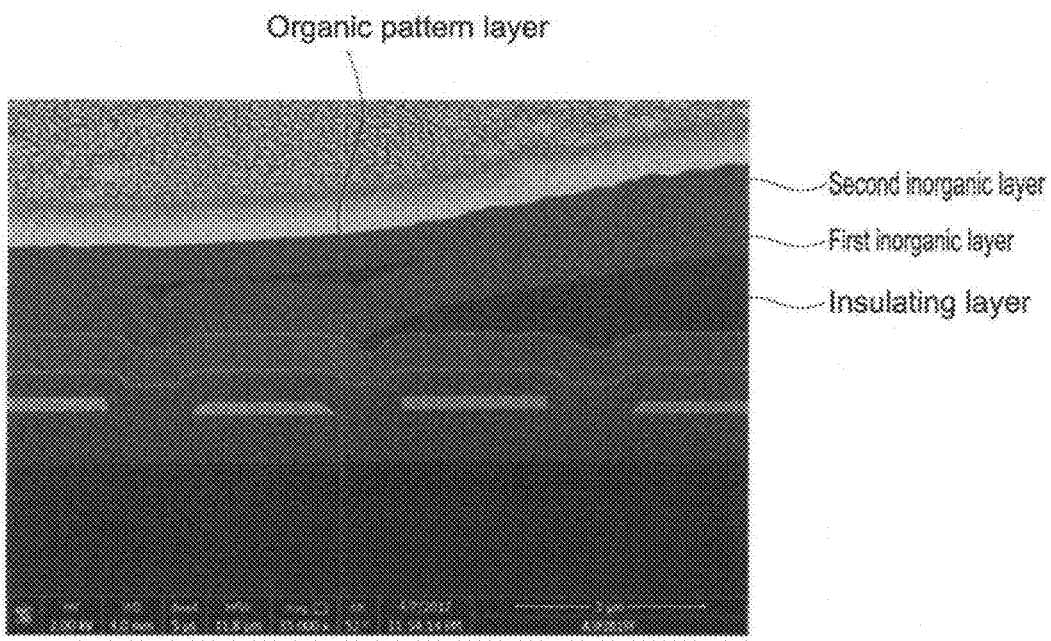
FIG. 4 is an SEM photograph showing a cross-sectional structure of an organic light emitting display device including an organic pattern layer according to an exemplary embodiment of the present invention.

According to an exemplary embodiment of the present invention, the organic pattern layer 340 that is spaced apart from the organic layer 320 is additionally formed between the first inorganic layer 310 and the second inorganic layer 330 which contact each other in the non-display area NDA. For example, the first inorganic layer 310 and the second inorganic layer 330 may contact each other in the non-display area NDA where the organic layer 320 and the organic pattern layer 340 are not disposed between the first inorganic layer 310 and the second inorganic layer 330. The organic pattern layer 340 absorbs the stress between the inorganic layers 310 and 330 and imparts flexibility. Accordingly, the organic pattern layer 340 may serve to realize a robust sealing structure by mitigating impact due to external force and suppressing crack occurrence. FIG. 4 is an SEM photograph showing a cross-sectional structure of an organic light emitting display device 10 including an organic pattern layer 340 according to an exemplary embodiment of the present invention. As illustrated in FIG. 4, crack does not occur at the weak point where the first and second inorganic layers 310 and 330 contact each other in contrast to that illustrated in FIG. 3. This is due to the formation of the organic pattern layer 340 overlapping the inclined side portion (e.g., an edge) of the insulating layer 109, and will be discussed further below.

In such an exemplary embodiment described above, it is necessary to dispose the organic pattern layer 340 at a specific position where cracks are likely to occur relative to other areas, in consideration of the structure of the encapsulation layer 300 and the process efficiency of the OLED display device 10. According to an exemplary embodiment of the present invention, the organic pattern layer 340 may be disposed apart from the organic layer 320 and between the first inorganic layer 310 and the second inorganic layer 330 that contact each other in the non-display area NDA. According to an exemplary embodiment of the present invention, the organic pattern layer 340 may be disposed at an area in which at least a portion of the non-display area NDA where the first inorganic layer 310 directly contacts the second inorganic layer 330, and at least a portion of an inclined side portion (e.g., an edge) of the insulating layer 109 and the organic pattern layer 340 overlap each other in a plan view. At least a portion of the organic pattern layer 340 may overlap the insulating layer 109 of the display unit 100 in a plan view. The organic pattern layer 340 disposed at the above-describe position may absorb the stress between the inorganic layers 310 and 330 that contact each other and may impart flexibility to suppress cracking. In addition, the organic pattern layer 340 may also be disposed at positions other than the one described above to prevent cracking by identifying the weak points such as the stress concentrated areas in the structure and applying the organic pattern layers 340 to the weak point areas to release the stress.

The organic pattern layer 340 may be formed by allowing a part of the organic layer 320, that is supposed to be removed during a process of manufacturing the organic layer 320, to remain, for example, on the first inorganic layer 310. Accordingly, the organic pattern layer 340 may be disposed apart from the organic layer 320, but may include a material substantially the same as a material included in the organic layer 320. For example, the organic pattern layer 340 may include at least one kind of organic material selected from: acrylic resins, methacrylic resins, isoprene resins, vinyl resins, epoxy resins, urethane resins, cellulose resins, phenylene resins, and imide resins. In addition, in consideration of the structure of the encapsulation layer and the effect of impact mitigation, the organic pattern layer 340 may have a width of about 10 μm or more and a thickness of about 0.1 μm or more. For example, to substantially prevent an overlap with a monomer jetting line, the organic pattern layer 340 may have a width in a range from about 10 μm to about 100 μm. In addition, not to affect the profile of the second inorganic layer 330, the organic pattern layer 340 may have a thickness in a range from about 0.1 μm to about 0.6 μm.

FIG. 1 exemplifies an embodiment in which the first inorganic layer 310, the organic layer 320, and the second inorganic layer 330 are sequentially stacked as an encapsulation layer, and the organic pattern layer 340 is disposed between the first inorganic layer 310 and the second inorganic layer 330 that contact each other in the non-display area NDA. However, the present invention is not limited thereto. For example, the stack structure of the inorganic layers and the organic layers and the number of layers in the encapsulation layer are not particularly limited, as long as there is the organic pattern layer 340 between the inorganic layers that contact each other in the non-display area NDA. That is, the encapsulation layer 300 may further include a plurality of inorganic layers and a plurality of organic layers that are alternately disposed, and the number of times of lamination of the inorganic layers and the organic layers is not particularly limited as well. For example, in an exemplary embodiment of the present invention, the encapsulation layer 300 may further include additional organic layer(s), organic pattern layer(s), and inorganic layer(s), other than the organic layer 320, the organic pattern layer 340, the first inorganic layer 310 and the second inorganic layer 330 shown in FIG. 1.

Figure 2:
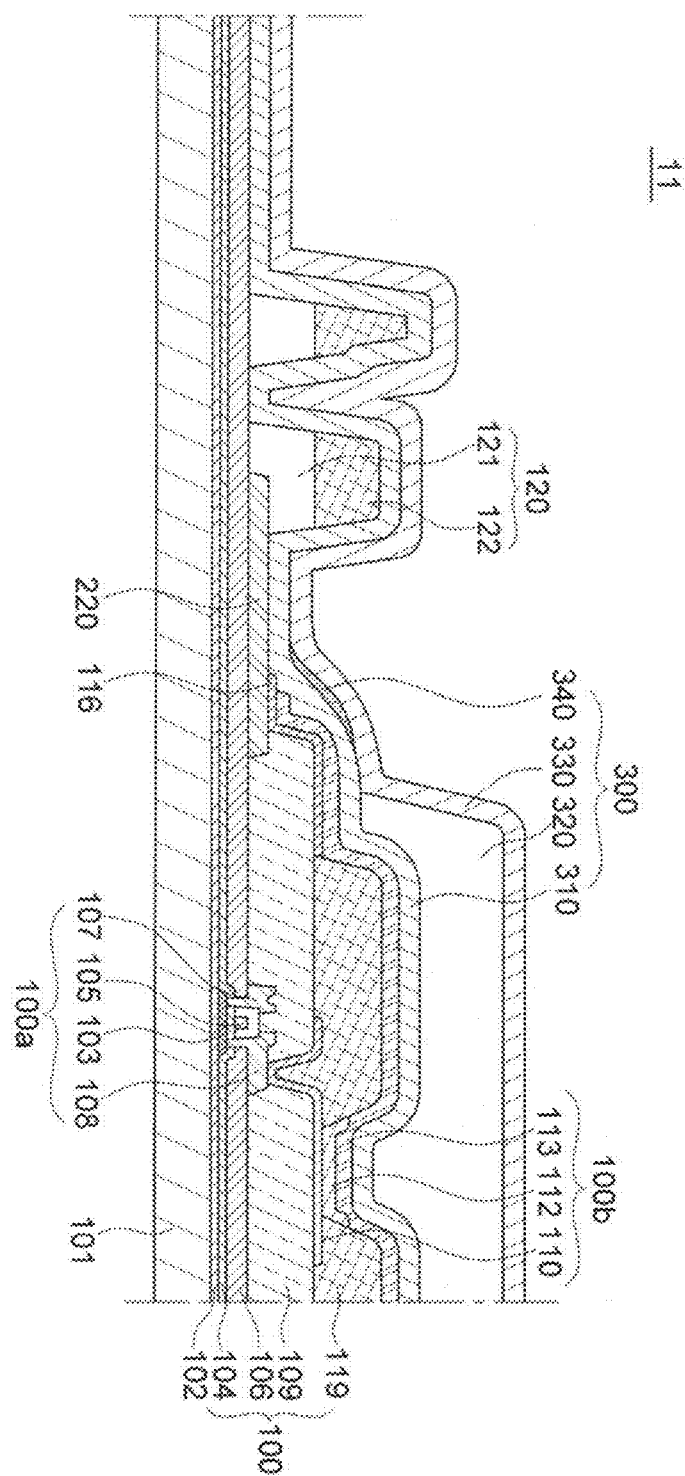
FIG. 2 is a cross-sectional view illustrating an organic light emitting display device according to an exemplary embodiment of the present invention.

FIG. 2 is a cross-sectional view illustrating an organic light emitting display device according to an exemplary embodiment of the present invention. In FIG. 2, the same reference numerals as those in FIG. 1 denote the same members.

In the following description of FIG. 2, the redundant descriptions described hereinabove with reference to FIG. 1 will not be provided, and only differences will be described.

Referring to FIG. 2, an OLED display device 11 according to the present exemplary embodiment may further include a dam portion 120 disposed in the non-display area NDA of the substrate 101, as compared with FIG. 1.

The dam portion 120 disposed outside the display area DA may substantially prevent an organic material for forming the organic layer 320 from flowing toward an edge of the substrate 101 when forming the organic layer 320 of the encapsulation layer 300, and accordingly, formation of an edge tail of the organic layer 320 may be substantially prevented. The dam portion 120 may surround the display area DA and have a predetermined height to enclose the display area DA.

The dam portion 120 may include a material substantially the same as a material included in at least one of the insulating layer 109 and the pixel defining layer 119. The dam portion 120 may include a plurality of layers. In an exemplary embodiment of the present invention, the dam portion 120 may include a first layer 121 which includes a material substantially the same as a material included in the insulating layer 109, and a second layer 122 which is on the first layer 121 and includes a material substantially the same as a material included in the pixel defining layer 119. However, the present invention is not limited thereto. For example, in an exemplary embodiment of the present invention, the dam portion 120 may include one layer. Alternatively, in an exemplary embodiment of the present invention, the dam portion 120 may include three or more layers. For process simplification, in an exemplary embodiment of the present invention, the first layer 121 of the dam portion 120 and the insulating layer 109 may be formed by an identical process, and/or the second layer 122 of the dam portion 120 and the pixel defining layer 119 may be formed by an identical process.

The dam portion 120 may be formed in plural. In an exemplary embodiment of the present invention, the plurality of dam portions 120 may have different heights. Within the plurality of dam portions 120, a height of one dam portion 120 near an outer portion of the substrate 101 may be greater than a height of another dam portion 120 near an inner portion of the substrate 101. That is, the height of the dam portion 120 may increase toward the outer portion of the substrate 101.

In the OLED display device 11 illustrated in FIG. 2, the first inorganic layer 310 and the second inorganic layer 330 may extend to the outside of the substrate 101 so as to cover the dam portion 120. Accordingly, the penetration of external moisture and oxygen to the OLED display device 11 may be delayed or blocked. In addition, since the dam portion 120 substantially blocks an organic material from flowing toward an edge of the substrate 101 when forming the organic layer 320, the organic layer 320 is to be disposed inside the dam portion 120 in the display area DA and the non-display area NDA. In addition, the organic pattern layer 340 may be disposed between the dam portion 120 and an inclined side portion (edge) of the insulating layer 109. The inclined side portion of the insulating layer 109 is inclined in a direction toward the dam portion 120. At least a portion of the organic pattern layer 340 may overlap the insulating layer 109 of the display unit 100 in a plan view. The first and second inorganic layers 310 and 330 may cover an outside surface of the dam portion 120 and may contact each other outside the dam portion 120 in the non-display area NDA. In addition, the first and second inorganic layers 310 and 330 may contact each other inside the dam portion 120 where the organic layer 320 and the organic pattern layer 340 are not disposed.

The dam portion 120 may be disposed so as to contact at least a part of the power wiring 220. For example, the dam portion 120 may be disposed so as to overlap and contact at least an outer edge of the power wiring 220. The dam portion 120 that includes a material substantially the same as a material included in at least one of the insulating layer 109 and the pixel defining layer 119 may have a good bonding strength with metal. Accordingly, when the dam portion 120 is disposed to contact the power wiring 220 that includes a metal material, the dam portion 120 may be stably constructed with excellent bonding strength with the power wiring 220.

Although FIG. 2 illustrates an example in which the dam portion 120 is disposed to overlap an outer edge of the power wiring 220, however, the present invention is not limited thereto. For example, in an exemplary embodiment of the present invention, the dam portion 120 may be disposed only on the power wiring 220, or may be disposed so as to cover the power wiring 220. Here, the power wiring 220 may be connected to the second electrode 113 via a wiring 116 for supplying power to the OLED 100b.

FIGS. 5, 6, 7 and 8 are cross-sectional views schematically showing a method of manufacturing the organic light emitting display device of FIG. 1 according an exemplary embodiment of the present invention.

Figure 5:
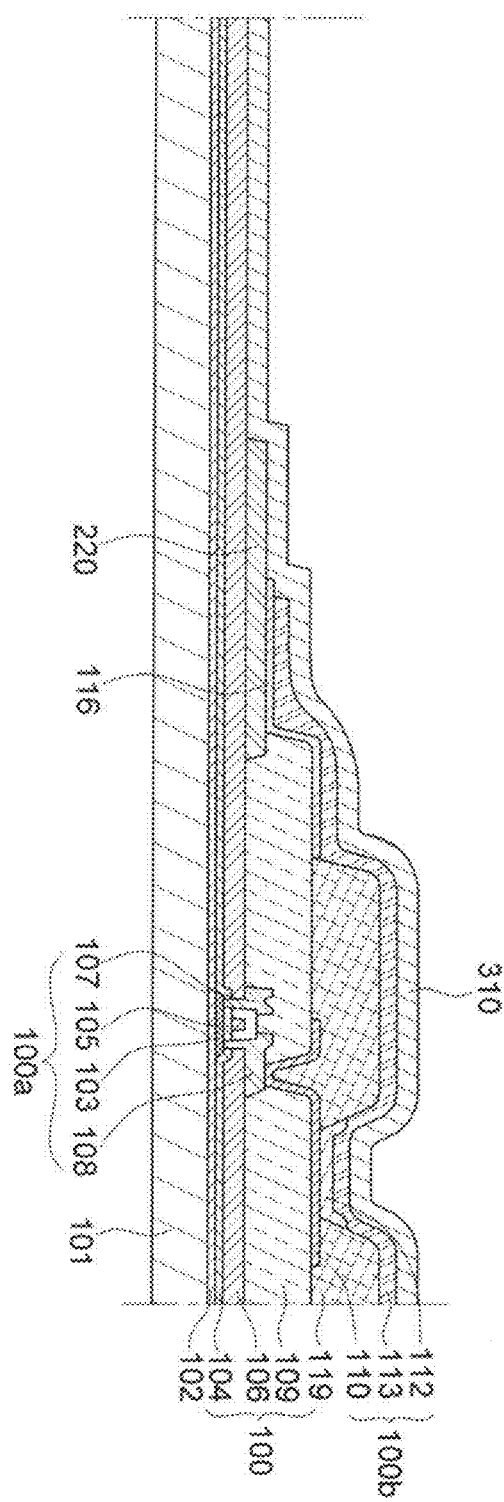
FIGS. 5, 6, 7 and 8 are cross-sectional views schematically showing a method of manufacturing the organic light emitting display device of FIG. 1 according to an exemplary embodiment of the present invention.

Referring to FIG. 5, the display unit 100 is formed on the substrate 101, and the first inorganic layer 310 which is over the display unit 100 and extends from the display unit 100 to cover a portion of the non-display area NDA is formed.

The display unit 100 may employ various OLED displays known in the art, in addition to the configuration exemplified in FIG. 1, and thus a specific method of manufacturing the display unit 100 will be omitted.

The first inorganic layer 310 may include an inorganic material such as metal oxide, metal nitride, or the like that are known in the art. Such a first inorganic layer 310 may be deposited by a method such as, for example, sputtering, atomic layer deposition (ALD), or chemical vapor deposition (CVD).

Figure 6:
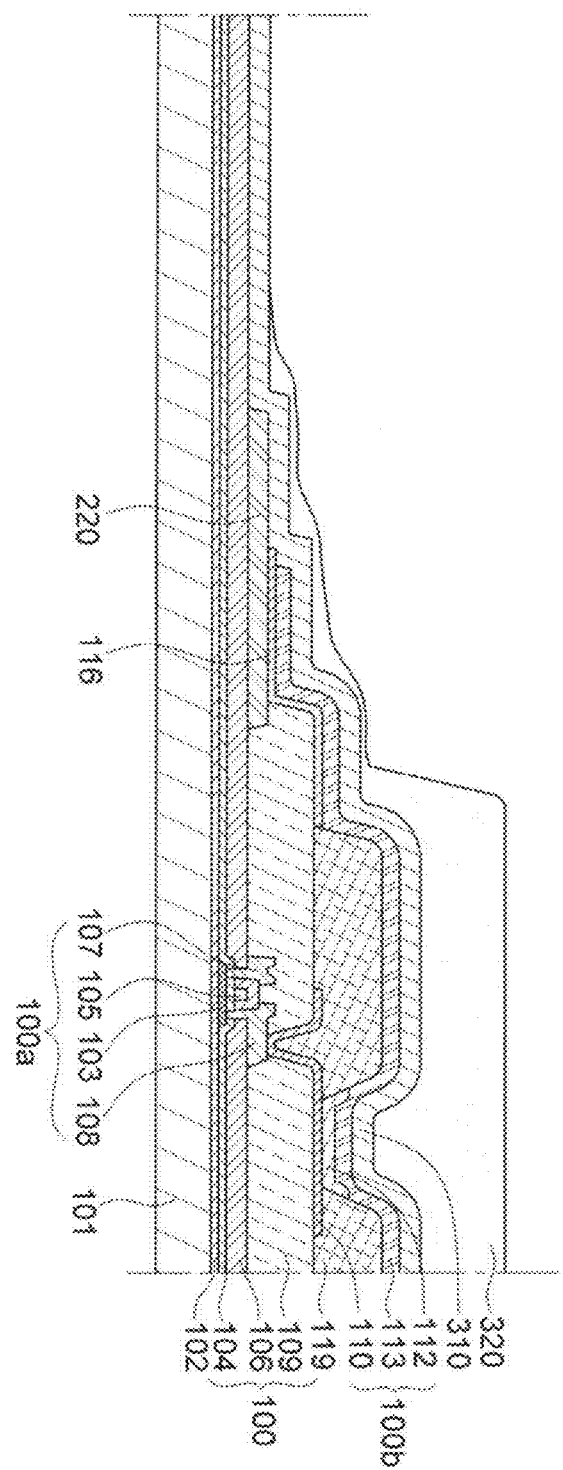

After the first inorganic layer 310 is formed, the organic layer 320 is formed as illustrated in FIG. 6.

The organic layer 320 may include any organic material known in the art, e.g., monomers and/or polymers, without limitation. Such an organic layer may be formed through various process methods known in the art and may be formed by one of, for example, an inkjet method, a slit coating method, a screen printing method, an evaporation method, and a chemical vapor deposition (CVD) method.

Figure 7:
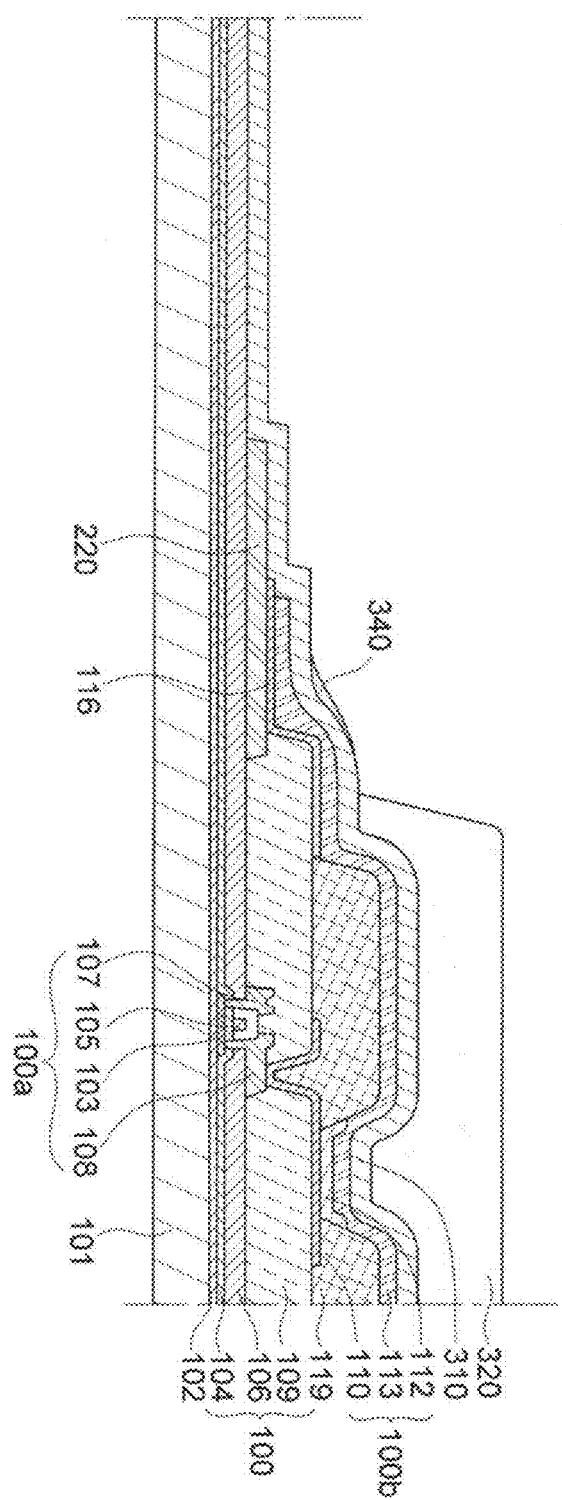

After the organic layer 320 is formed, a part of the organic layer 320 is removed as illustrated in FIG. 7. More specifically, the tail of the organic layer 320 is removed, and a part of the organic layer 320 is left in the non-display area NDA to form the organic pattern layer 340 that is spaced apart from the organic layer 320.

The organic pattern layer 340 may be formed by an ashing process using a cleaning mask. The cleaning mask may be formed through a photolithographic process. The ashing process is a dry etch process in which a gas such as oxygen ($O_2$), nitrous oxide ($N_2O$) or ammonia ($NH_3$) is accelerated in a plasma state to remove carbon-based organic substances remaining at the bottom to be cleaned. It is preferable that the organic pattern layer 340 is formed by an oxygen ($O_2$) ashing process. For example, after disposing a cleaning mask on the organic layer 320 in a chamber, the ashing process is performed using the cleaning mask. In particular, according to an exemplary embodiment of the present invention, the pattern of the organic layer 320 to be removed may be freely controlled by partially modifying the design of the cleaning mask applied to the ashing process, and thus the organic pattern layer 340 on one side portion (edge) of the insulating layer 109 remains and the tail of the organic layer 320 other than the one side portion is removed in the non-display area NDA.

Any cleaning mask that is commonly used in the ashing process may be used without limitation, except that the design is partially modified. In addition, the conditions of the ashing process are not particularly limited. For example, conditions such as the internal pressure of the chamber, the oxygen flow rate, or the applied power may be appropriately adjusted within the range known in the art.

Figure 8:
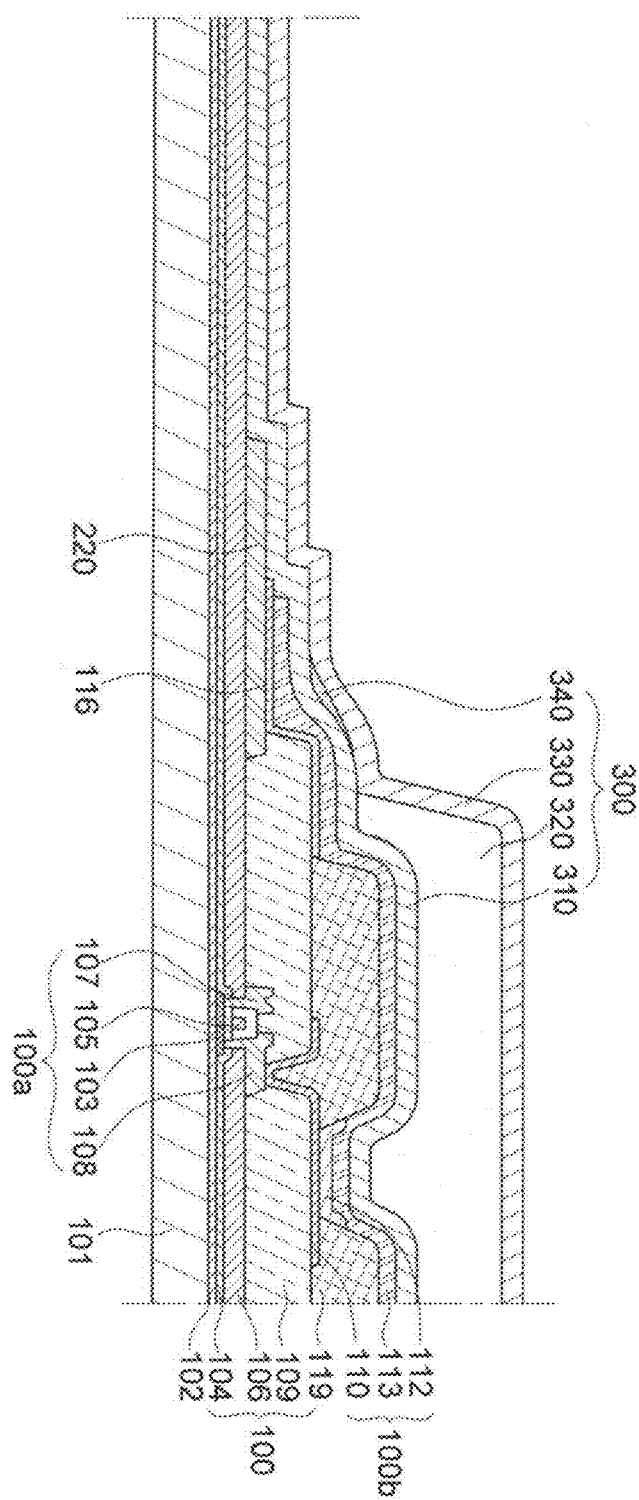

Next, the second inorganic layer 330 is formed to cover the organic layer 320 and further extends to cover a part of the non-display area NDA, as illustrated in FIG. 8.

The second inorganic layer 330 may be formed by, for example, sputtering, atomic layer deposition (ALD), chemical vapor deposition (CVD), or the like. The second inorganic layer 330 may include an inorganic material such as metal oxide or metal nitride that are known in the art. For example, the second inorganic layer 330 may include a material substantially the same as or different from a material included in the first inorganic layer 310 described above.

The method according to an exemplary embodiment of the present invention may further include forming the dam portion 120 disposed in the non-display area NDA of the substrate 101. Since the dam portion 120 may have the configuration exemplified in FIG. 2, a specific manufacturing method thereof will be omitted. For example, the dam portion 120 may be formed in a process substantially the same as a process in which at least one of the insulating layer 109 and the pixel defining layer 119 is formed with a material substantially the same as a material included in the at least one of the insulating layer 109 and the pixel defining layer 119. The dam portion 120 and at least one of the insulating layer 109 and the pixel defining layer 119 may be formed of a photosensitive material through a photolithographic process. Accordingly, the dam portion 120 and at least one of the insulating layer 109 and the pixel defining layer 119 may be substantially formed simultaneously through an exposure process using a halftone mask by adjusting an exposure amount. However, the present invention is not limited thereto. For example, at least one of a preliminary insulating layer and a pixel defining layer may be formed on the substrate 101 through spin coating process, an etch mask may be formed on at least one of the preliminary insulating layer and the preliminary pixel defining layer through an photolithographic process, and an etching process may be carried out through the etch mask to etch at least one of the preliminary insulating layer and the preliminary pixel defining layer to form the dam portion 120 and the at least one of the insulating layer 109 and the pixel defining layer 119 simultaneously.

The OLED display device according to an exemplary embodiment of the present invention includes a separate organic pattern layer that may absorb stress and impart flexibility between inorganic layers that directly contact each other in the non-display area NDA, and thus may suppress cracking and achieve a robust structure of an encapsulation layer. Such OLED display devices may be applied not only to flat panel display (FPD) devices but also to any display devices such as, for example, curved display devices, foldable display devices and flexible display devices in the field of the present invention.

As set forth hereinabove, the OLED display device according to an exemplary embodiment of the present invention includes a separate organic pattern layer that may absorb stress and impart flexibility between the first inorganic layer and the second inorganic layer. Accordingly, the impact caused by an external force may be mitigated and the crack generation may be suppressed, and thereby a robust encapsulation structure may be realized.

The OLED display device according to an exemplary embodiment of the present invention may form the organic layer and the organic pattern layer substantially simultaneously without using a separate manufacturing process. Accordingly, the manufacturing cost of the OLED display device may be low.

While the present invention has been illustrated and described with reference to the exemplary embodiments thereof, it will be apparent to those of ordinary skill in the art that various changes in form and detail may be made therein without departing from the spirit and scope of the present invention as defined by the appended claims.

What is claimed is:

1. An organic light emitting display device comprising:
a substrate comprising a display area and a non-display area;
a thin film transistor disposed on the substrate in the display area;
an insulating layer disposed on the thin film transistor;
an organic light emitting element disposed on the insulating layer and connected to the thin film transistor; and
an encapsulation layer covering the organic light emitting element,
wherein the encapsulation layer comprises:
a first inorganic layer disposed on the organic light emitting element and extending from the organic light emitting element to the non-display area;
an organic layer disposed on the first inorganic layer;
a second inorganic layer disposed on the organic layer and extending from the organic layer to the non-display area; and
an organic pattern layer disposed between the first inorganic layer and the second inorganic layer so as to be spaced apart from the organic layer in the non-display area,
wherein at least a part of the first inorganic layer and at least a part of the second inorganic layer contact each other in the non-display area, and
a thickness of the organic pattern layer is smaller than a thickness of the organic layer.

2. The organic light emitting display device of claim 1, wherein at least a part of the organic pattern layer overlaps the insulating layer in a plan view.

3. The organic light emitting display device of claim 1, wherein the organic pattern layer comprises a material the same as a material which the organic layer comprises.

4. The organic light emitting display device of claim 1, wherein the organic layer comprises at least one kind of organic material selected from: acrylic resins, methacrylic resins, isoprene resins, vinyl resins, epoxy resins, urethane resins, cellulose resins, phenylene resins, and imide resins.

5. The organic light emitting display device of claim 1, wherein the organic pattern layer has a width of about 10 µm or more and the thickness of about 0.1 µm or more.

6. The organic light emitting display device of claim 1, wherein the first inorganic layer and the second inorganic layer have a equal area in a plan view, and
an area of the organic layer is less than an area of the first inorganic layer and an area of the second inorganic layer.

7. The organic light emitting display device of claim 1, wherein the first inorganic layer and the second inorganic layer each independently comprises at least one kind of inorganic material selected from: silicon oxide, silicon nitride, silicon oxynitride, aluminum oxide, aluminum nitride, aluminum oxynitride, titanium oxide, titanium nitride, tantalum oxide, tantalum nitride, hafnium oxide, hafnium nitride, zirconium oxide, zirconium nitride, cerium oxide, cerium nitride, tin oxide, tin nitride, and magnesium oxide.

8. The organic light emitting display device of claim 1, further comprising a dam portion disposed in the non-display area of the substrate.

9. The organic light emitting display device of claim 8, wherein the insulating layer comprises a side portion inclined in a direction toward the dam portion.

10. The organic light emitting display device of claim 9, wherein the organic pattern layer is disposed between the dam portion and the inclined side portion of the insulating layer.

11. The organic light emitting display device of claim 9, wherein the organic pattern layer is disposed at an area in which at least a part of the non-display area where the first inorganic layer and the second inorganic layer contact each other and at least a part of the inclined side portion of the insulating layer and the organic pattern layer overlap each other in a plan view.

12. The organic light emitting display device of claim 8, wherein the dam portion is provided in plural and the plurality of dam portions have different heights.

13. The organic light emitting display device of claim 8, further comprising a pixel defining layer disposed between the insulating layer and the encapsulation layer, the pixel defining layer defining a pixel area of the organic light emitting element,
wherein the dam portion comprises a material the same as a material which at least one of the insulating layer and the pixel defining layer comprises.

14. The organic light emitting display device of claim 13, wherein the dam portion comprises:

a first layer comprising a material the same as a material which the insulating layer comprises; and a second layer on the first layer, the second layer comprising a material the same as a material which the pixel defining layer comprises.

15. An organic light emitting display device comprising:

a thin film transistor disposed on a substrate in a display area, the substrate comprising the display area and a non-display area;

an insulating layer disposed on the thin film transistor, the insulating layer comprising an inclined side portion in the non-display area;

an organic light emitting element disposed on the insulating layer and connected to the thin film transistor; and an encapsulation layer covering the organic light emitting element, wherein the encapsulation layer comprises:

a first inorganic layer disposed on the organic light emitting element and extending from the organic light emitting element to the non-display area;

an organic layer disposed on the first inorganic layer to cover a part of the first inorganic layer;

an organic pattern layer disposed on the first inorganic layer, spaced apart from the organic layer, and overlapping at least a part of the inclined side portion of the insulating layer in a plan view; and a second inorganic layer disposed on the organic layer, extending from the organic layer to the non-display area, covering the organic pattern layer, and contacting the first inorganic layer in the non-display area where the organic layer and the organic pattern layer are not disposed on the first inorganic layer.

16. The organic light emitting display device of claim 15, wherein the organic pattern layer comprises a material the same as a material which the organic layer comprises.

17. The organic light emitting display device of claim 15, wherein the first inorganic layer and the second inorganic layer have an equal area in the plan view.

* * * * *